United States Patent [19]
Kabat et al.

[11] Patent Number: 5,796,594
[45] Date of Patent: Aug. 18, 1998

[54] INTERLOCKING CIRCUIT CARD FACEPLATE FOR REDUCED EMI EMISSIONS

[75] Inventors: Zbigniew Kabat, Schaumburg; Richard A. Walton, Carol Stream, both of Ill.

[73] Assignee: AG Communication Systems Corporation, Phoenix, Ariz.

[21] Appl. No.: 831,120

[22] Filed: Apr. 1, 1997

[51] Int. Cl.$^6$ .................................................. H05K 9/00
[52] U.S. Cl. ........................ 361/818; 361/748; 361/759; 361/816; 174/35 R
[58] Field of Search ........................ 361/752, 753, 361/759, 748, 800, 816, 818; 174/35 R, 35 GL

[56] References Cited

U.S. PATENT DOCUMENTS 5,233,507  8/1993  Gunther et al. .................. 361/818
5,278,351  1/1994  Herrick ........................... 361/818 X
5,347,430  9/1994  Curlee et al. .................... 361/816

*Primary Examiner*—Leo P. Picard
*Assistant Examiner*—Jayprakash N. Gandhi
*Attorney, Agent, or Firm*—David J. Zwick; Gregory G. Hendricks

[57] ABSTRACT

A circuit card faceplate, that is opaque to EMI emissions of a predetermined spectral range, having a tongue extending along one side edge, and a groove extending along the other side edge. The groove is arranged to receive and interlockingly engage a corresponding tongue on a side edge of an adjacent faceplate such that the tongue and groove engagement form a seam that is opaque to EMI emissions of the predetermined spectral range. The circuit card faceplate allows for top insertion of circuit card assemblies.

2 Claims, 3 Drawing Sheets

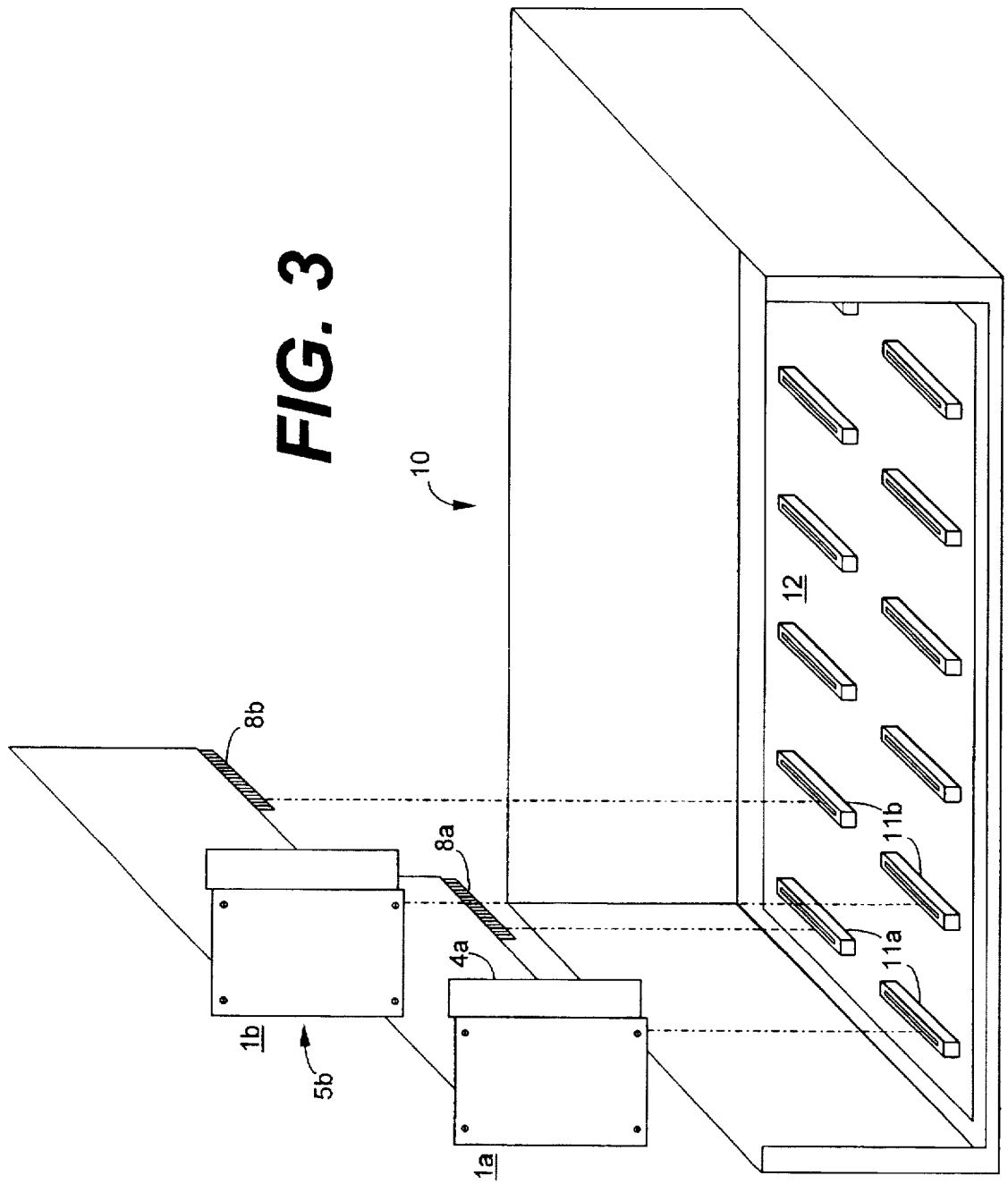

INTERLOCKING CIRCUIT CARD FACEPLATE FOR REDUCED EMI EMISSIONS

FIELD OF THE INVENTION

The present invention relates to circuit cards. More particularly, the present invention relates to circuit cards having a faceplate adapted to reduce EMI emissions.

BACKGROUND OF THE INVENTION

Many types of electrical systems emit extraneous electromagnetic radiation, referred to as electromagnetic interference (EMI), into the environment during normal operation. EMI normally is generated by analog components that oscillate at high frequencies, or digital components which have high clocking or switching rates. EMI is undesirable because at sufficient strengths, it can adversely affect the operation of other nearby electrical systems. With the increasing use of such analog and digital systems, the actual and potential problems resulting from EMI have increased correspondingly. In response, the Federal Communications Commission (FCC) established regulations governing the maximum allowable levels of EMI for various types of electrical equipment. These regulations must be considered in the design of equipment that may produce EMI.

Electrical equipment of the type considered by the present invention typically comprises an electronic housing having an opening on the front face with a row of circuit cards therein in a side-by-side stacked arrangement. The circuit cards comprise a faceplate with a printed wiring circuit board attached thereto. When the circuit cards have been installed in the electronic enclosure, the faceplates of the circuit cards complete the front face of the housing.

In this type of equipment, the top, bottom, back and sides of the enclosure would be grounded and provide an effective EMI barrier. The faceplates are preferably of an electrically conductive material, or have an electrically conductive coating, and are opaque to the EMI emissions of concern. The faceplates are usually also in good electrical contact with the enclosure. However, small gaps are usually present between adjacent faceplates which can act as slot antennae. Despite their small width, these gaps can allow undesirable amounts of EMI to escape the enclosure. An effective design must be incorporated to reduce the problem of EMI emissions escaping through the gaps between adjacent faceplates.

A common solution to the problem of interstitial EMI emissions from between the faceplates is to provide a specially designed EMI gasket along one or more edge surfaces of each faceplate. The EMI gasket is usually comprised of some form of a resilient metal strip. A common implementation of the EMI gasket is a conductive metal strip folded into a "D" shape having transverse arcuate resilient metal fingers forming the curved portion of the "D." The gasket would be attached to the faceplate edge along the flat portion of the "D." When a circuit card is properly seated in the electronic enclosure, the arcuate fingers of the EMI gasket come into electrical contact with the adjacent faceplate's edge. The EMI gasket fills the gap from an electrical standpoint, and the faceplates, in conjunction with the gaskets, form an effective EMI barrier.

One problem with this approach is that after repeated compression of the EMI gasket that occurs through the normal insertion and removal of the circuit card in an electronic enclosure, there may be a loss of resiliency of the gasket, leading to a loss of good electrical contact, and a reduction of EMI shielding ability.

Another problem with this approach is that mechanical abrasion of the faceplate surface by the EMI gasket of an adjacent circuit card, caused by repeated insertion of the adjacent circuit card, can remove an electrically conductive coating on the faceplate, leading to a loss of good electrical contact, and thus a reduction of EMI shielding ability Another problem with this approach is that EMI gaskets normally have designs disposing them to an insertion axis that is perpendicular to the plane of the faceplate, or front insertion.

Accordingly, an object of the present invention is to provide a circuit card having a faceplate that acts as an effective EMI barrier that does not require an EMI gasket.

Another object of the present invention is to provide a circuit card having a faceplate that acts as an effective EMI barrier, that does not experience reduced effectiveness as an EMI barrier over time through normal use.

Another object of the present invention is to provide a circuit card having a faceplate that acts as an effective EMI barrier that is adapted to an insertion axis parallel to the plane of the faceplate, or top insertion.

SUMMARY OF THE INVENTION

The present invention is a circuit card with a faceplate having an interlocking geometry for ensuring an EMI compliant seam between adjacent faceplates. The interlocking geometry also provides the ability to insert the circuit cards from the top of an electronic housing to, for example, seat the circuit cards onto a motherboard oriented along, and located near, the bottom face of the enclosure.

The interlocking geometry comprises a tongue-and-groove design in which a tongue and a groove of a circuit card faceplate are located on opposite side edges of the faceplate, and oriented to point in a sidewards direction to the two adjacent faceplates. Circuit cards are inserted into the electronic housing from the top by aligning the tongue of the faceplate with the corresponding groove of the adjacent faceplate, and the groove of the faceplate with the corresponding tongue of the opposite adjacent faceplate, along their respective longitudinal axes. The circuit card is then slid into the slot formed by the adjacent faceplates so as to fully engage the tongues and corresponding grooves along their respective lengths, to the extent that the circuit card is seated on the motherboard.

A series of circuit cards with their faceplates in an interlocked tongue-and-groove arrangement as described above and forming the front face of an electronic enclosure acts as an effective EMI barrier.

DESCRIPTION OF THE DRAWINGS

FIG. 3 shows a simplified view of how circuit cards of the present invention are installed into an electronic housing.

DESCRIPTION OF THE PREFERRED EMBODIMENT

Figure 1:
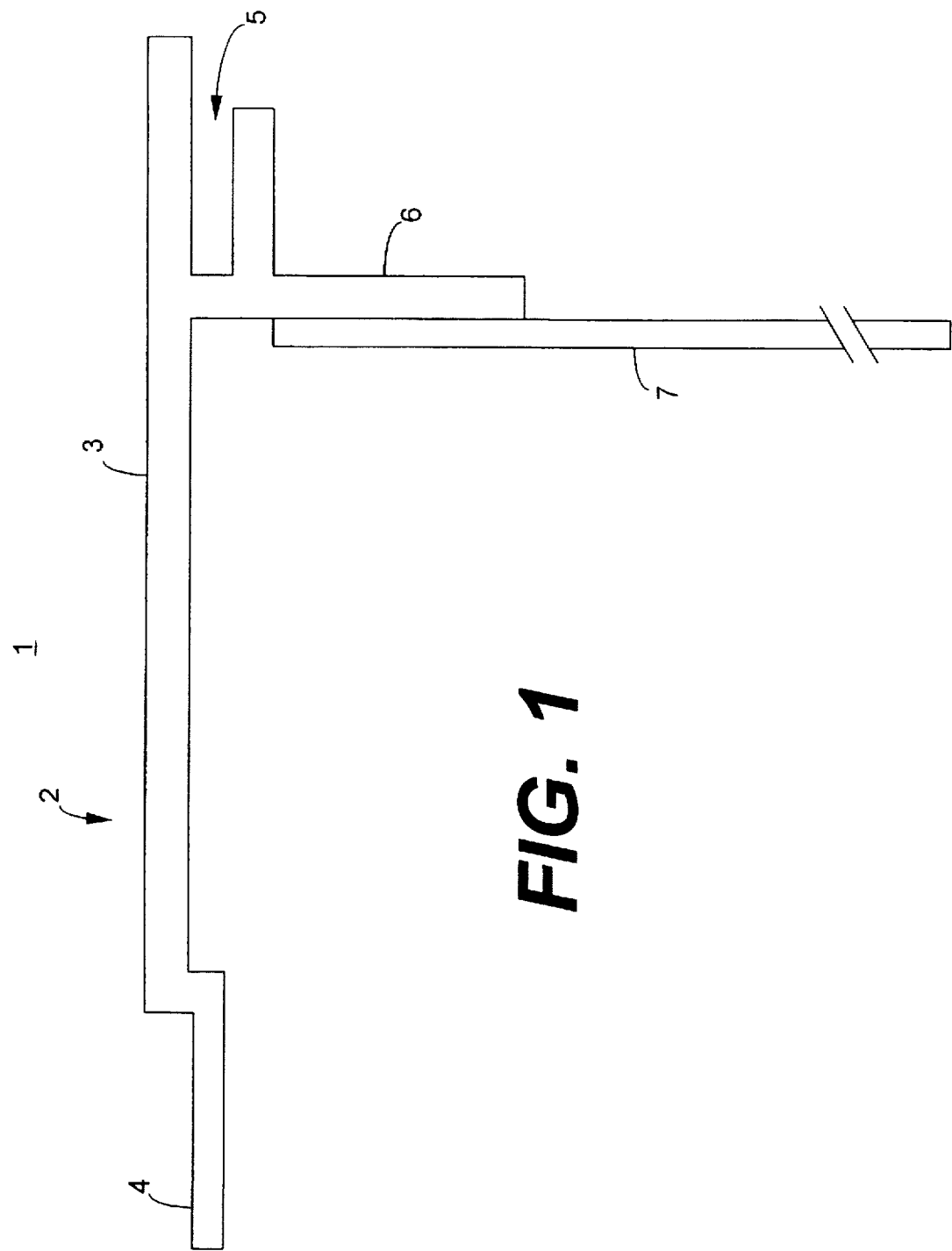
FIG. 1 shows a simplified top view of the circuit card of the present invention.

FIG. 1 shows a simplified top view of a circuit card according to the present invention. Circuit card 1 includes faceplate 2 comprising a frontispiece 3, a tongue 4 along one lateral edge of faceplate 2, a groove 5 along the opposite lateral edge of faceplate 2, and a printed wiring circuit board support bracket assembly 6, and printed wiring circuit board 7 connected to faceplate 2 by circuit board support bracket assembly 6. Faceplate 2 is preferably of an electrically conductive material or has an electrically conductive coating in accordance with known techniques.

Groove 5 is dimensioned to accept a tongue 4 of an adjacent faceplate 2. Tongue 4 and groove 5 are aligned such that when a plurality of faceplates 2 are in interlocked engagement, in a tongue-in-groove manner, frontispieces 3 are, for example, coplanar.

Figure 2:
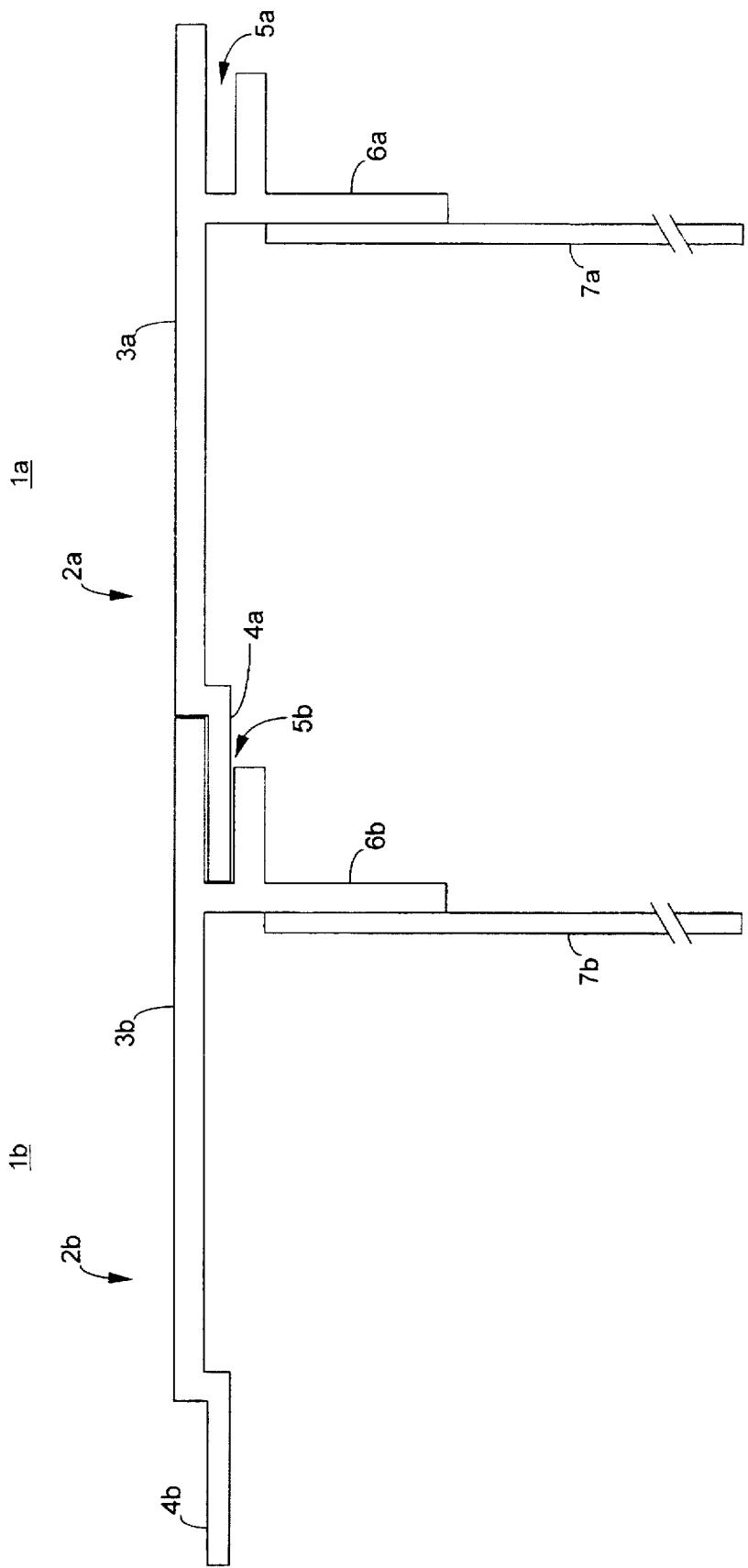
FIG. 2 shows a simplified top view of two interlocked circuit cards in the manner of the present invention.

FIG. 2 shows a top view of two adjacent circuit cards 1 with faceplates 2 in interlocked engagement in the manner of the present invention. Tongue $4a$ is engaged in groove $5b$ along their respective lengths. In like manner, tongue $4b$ and groove $5a$ would similarly engage adjacent faceplates. As shown in FIG. 2, frontispieces 3 are coplanar. Printed wiring circuit boards 7 are mounted to faceplates 2 on mounting brackets 6. The dimensions governing the tongue-and-groove engagement are controlled by the wavelength of the highest frequency component of the EMI emissions for which shielding is desired.

FIG. 3 shows how circuit cards 1 of the present invention are installed into an electronic housing 10. For purposes of illustration, the top cover to electronic housing 10 is not shown. Circuit card $1a$ is installed into electronic housing 10 by inserting circuit card $1a$ from the top of housing 10 and seating edge connector tabs $8a$ into connector sockets $11a$ on motherboard 12. In similar fashion, circuit card $1b$ is installed in electronic housing 10. When installing circuit card $1b$, groove $5b$ is aligned with tongue $4a$ along their respective longitudinal axes. Circuit card $1b$ is then slid down towards motherboard 12 so as to fully engage tongue $4a$ in groove $5b$ along their respective lengths, to the extent that edge connector tabs $8b$ are seated in connector sockets $11b$ on motherboard 12. When all circuit cards 1 have been installed in electronic enclosure 10, a top cover is attached to the enclosure. Enclosure 10 preferably provides an effective EMI barrier.

In practice, the top and bottom edges of each faceplate and the lateral edges of the two end faceplates where they abut the enclosure must also have proper EMI shielding for effective EMI containment in the enclosure. This shielding can be achieved using the tongue-and-groove arrangement of the present invention wherein the front opening of the enclosure engages the top and bottom edges of each faceplate and the lateral edges of the two end faceplates. This shielding can also be achieved through other known techniques, including the use of EMI gaskets.

In order for the EMI shielding to be effective, each circuit card faceplate must also be electrically grounded. This is preferably accomplished through mechanically securing the faceplates to the face of the electronic enclosure to ensure a good electrical contact between the faceplates and the grounded enclosure.

Although directional terms such as "top", "bottom", etc., are used to describe this exemplary embodiment, they should not be construed as limiting the operational orientation of the aforementioned electronic enclosure or circuit cards.

While the inventive system has been particularly shown and described, it is not intended to be exhaustive nor to limit the invention to the embodiment disclosed. It will be apparent to those skilled in the art that modifications can be made to the present invention without departing from the scope and spirit thereof. It is intended that the scope of the invention be defined by the claims appended hereto and their equivalents.

What is claimed is:

1. A circuit card assembly comprising:

a printed wiring circuit board;

a faceplate connected to said circuit board, and having a first lateral edge and a second opposing lateral edge, said faceplate being opaque to EMI emissions of a predetermined spectral range;

a tongue extending along and outward of said first lateral edge;

a groove extending along and inward of said second lateral edge; and said groove arranged to receive and interlockingly engage a corresponding tongue on a lateral edge of an adjacent faceplate;

whereby said tongue and groove engagement form a seam that is opaque to EMI emissions of said predetermined spectral range.

2. A circuit card assembly according to claim 1, wherein said groove and said tongue are such that said interlocking engagement occurs along the collinear axis of said tongue and said adjacent groove.

* * * * *